US008621107B2

(12) United States Patent
Hannu et al.

(10) Patent No.: US 8,621,107 B2
(45) Date of Patent: Dec. 31, 2013

(54) STATE-MEDIATED DATA SIGNALING USED FOR COMPRESSION IN TELECOMMUNICATION SERVICES

(75) Inventors: Hans Hannu, Lulea (SE); Jan Christoffersson, Lulea (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 2500 days.

(21) Appl. No.: 10/551,082

(22) PCT Filed: Mar. 26, 2004

(86) PCT No.: PCT/SE2004/000475
§ 371 (c)(1),
(2), (4) Date: Sep. 27, 2005

(87) PCT Pub. No.: WO2004/088850
PCT Pub. Date: Oct. 14, 2004

(65) Prior Publication Data
US 2006/0270418 A1 Nov. 30, 2006

(30) Foreign Application Priority Data
Apr. 1, 2003 (SE) ...................... 0300973

(51) Int. Cl.
*G06F 15/16* (2006.01)
(52) U.S. Cl.
USPC ........................................... 709/247
(58) Field of Classification Search
USPC ................................ 709/247, 246
See application file for complete search history.

(56) References Cited

U.S. PATENT DOCUMENTS

| 6,963,587 B2 * | 11/2005 | Hannu et al. ............ 370/477 |
| 2002/0132613 A1 | 9/2002 | Leung |
| 2003/0028673 A1 * | 2/2003 | Lin et al. ............ 709/247 |
| 2003/0041095 A1 * | 2/2003 | Konda et al. ............ 709/201 |
| 2004/0059835 A1 * | 3/2004 | Liu et al. ............ 709/247 |

FOREIGN PATENT DOCUMENTS

| WO | WO 02073810 A1 | 9/2002 |
| WO | WO 03003695 A1 | 1/2003 |

OTHER PUBLICATIONS

Bormann, C et al., "Signaling Compression (SigComp)" IETF: Request for Comments: 3320;. Retrieved on Oct. 30, 2003, http://www.ietf.org/rfc/rfc3320.txt, sections 2; 3; 3.2; 3.3.3; 6; 9.4.6; 9.4.9 and figures 1, 2, 6.
Christoffersson, J. et al: "Signaling Compression (SigComp)—Extended Operations" IETF: Request for Comments: 3321;. Retrieved on Oct. 28, 2003 from http://www.ietf.org/rfc/rfc3321.txt?number=3321, sections 5.4; 6.2, pp. 121-125.

* cited by examiner

*Primary Examiner* — Krista Zele
*Assistant Examiner* — Esther Benoit

(57) ABSTRACT

The invention relates to message-based communication between at least two units (100; 200) participating in a communications session. A first communications unit (100) generates and stores a state (10) comprising unit-associated data applicable for multiple messages to be communicated between the unit (100) and a second unit (200). A copy of this state (10) is then transmitted to the second unit (200), where it is stored. The state (10) and state copy can now be used in message processing for the purpose of reducing the message size and reducing utilization of communications resources. Data contained in the state (10) or state copy and found in the message (m1) is removed from the message prior transmission thereof. The resulting reduced-size message (m1'USD) is transmitted to the receiving unit, where the message (m1'USD) is anew processed by re-entering the data, removed by the transmitting unit, into the message (m1'USD) using the state copy or state. The original message (m1) is then recreated.

27 Claims, 9 Drawing Sheets

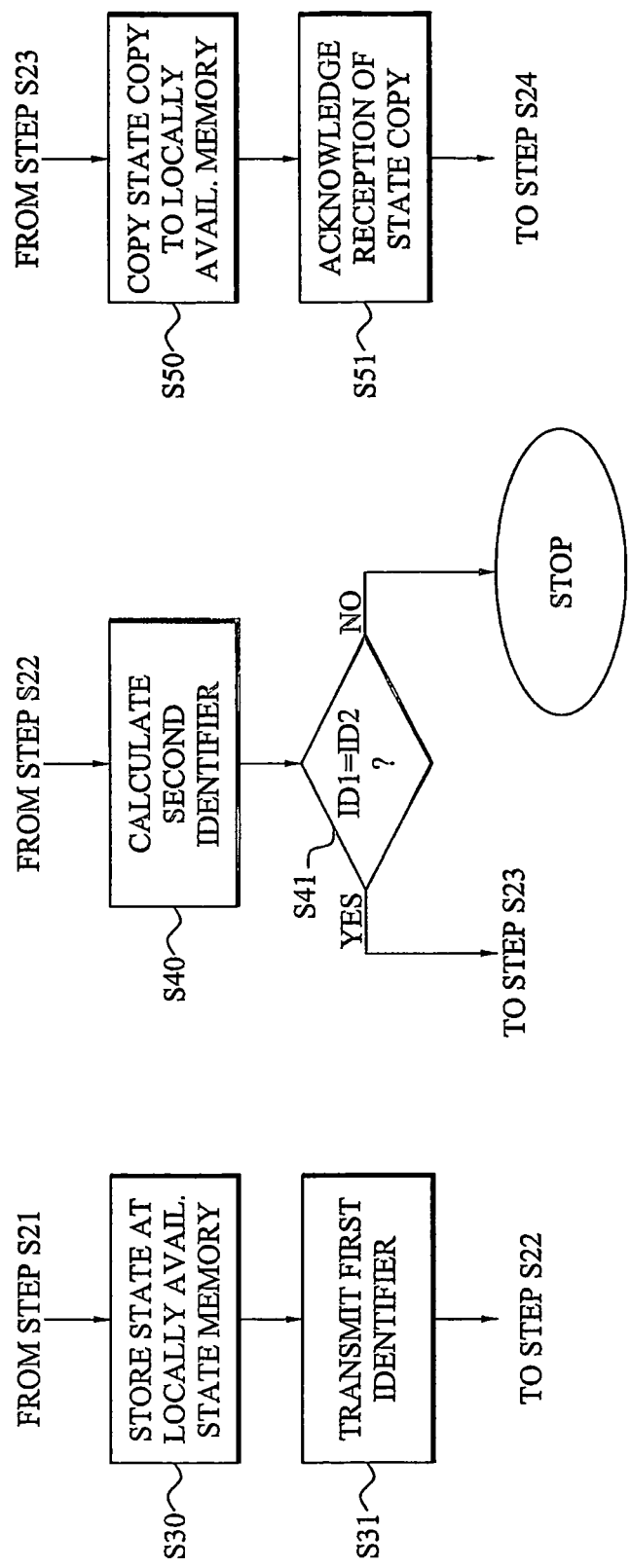

STATE-MEDIATED DATA SIGNALING USED FOR COMPRESSION IN TELECOMMUNICATION SERVICES

TECHNICAL FIELD

The present invention generally relates to data signaling in data communications systems, and in particular to state-mediated message-based data signaling in such systems.

BACKGROUND

Today there is an increasing trend of data communication between communicating units in different data communications systems. Typical examples are data communication between computers connected over a communications system such as Internet or a local area network and data communication between mobile user equipment and a communications server or node or another mobile user equipment over a radio communications system.

Many application protocols used in the data communication require that certain information and data is included in the data messages transmitted over the communications system. This data could be required for enabling efficient delivery of the data messages throughout the system and/or could be used by the receiving communications unit for interpreting and processing the received data messages. As a consequence many of the communicated data messages include fields that always comprise more or less the same data for a given pair or combination of communications units. This is generally no problem in communications systems with bandwidth rich communications links. However, in radio communications systems and other systems with typically a limited amount of available communications resources there is a general desire to reduce the amount of data that has to be transmitted between communicating units.

In addition, multimedia data messages are typically engineered for bandwidth rich links. Today, multimedia services employing such multimedia messages are also emerging for radio communications systems with, generally, poor bandwidth links. As a result, problems may arise since the multimedia messages have not been optimized in terms of size for such radio communications systems. For example, typical Session Initiated Protocol (SIP) messages range from a few hundred bytes up to two thousand bytes or more. With the use of these protocols in wireless mobile units as part of radio communications networks, the large message size is problematic. With low-rate Internet Protocol (IP) connectivity the transmission delays are significant. Taking into account retransmissions, and the multiplicity of messages that are required in some flows, call setup and feature invocation are adversely affected.

A possible solution could then be to employ a compression algorithm for compression of transmitted (multimedia) data messages and, thus, a reduction of the amount of data that has to be transmitted for each such message.

There are several different such compression techniques available for data compression in e.g. mobile communications systems. A typical example is the signal compression SigComp that was recently developed and is further described in the Request for Comments (RFC) documents [1, 2]. SigComp is a compression solution for compressing data messages generated by application protocols such as SIP, Session Description Protocol (SDP) and the Real Time Streaming Protocol (RTSP) and offers a robust, lossless compression of such application messages.

However, even the data messages compressed by SigComp and other compression protocols still comprise certain information fields that typically always comprise the same data for a given communications units pair. Although a compression technique reduces an overall size of a data message to be communicated over a communications system there may still be problems with the limited availability of communications resources, in particular for radio communications systems and other bandwidth poor systems. Thus, there is a need to further reduce the size of communicated data messages and compressed data messages.

SUMMARY

The present invention overcomes these and other drawbacks of the prior art arrangements.

It is a general object of the present invention to provide a data signaling that reduces the utilization of communications resources for inter-unit data communication.

It is another object of the invention to provide a message-based data signaling that enables reduction of the size of data messages transmitted between communications units.

Yet another object of the invention is to provide a state-mediated data signaling in communications systems.

These and other objects are met by the invention as defined by the accompanying patent claims.

Briefly, the present invention involves a state-mediate message-based data signaling in a communications system. A state that comprises communications unit-associated data and is applicable for multiple data messages to be transmitted between at least two communications units is generated and used for the inter-unit data communication.

The present invention is based on the observation that certain fields in communicated messages typically more or less often comprise the same information and data for a specific pair or combination of communications units. Thus, this same data is transmitted over and over again for the messages between the communications units. The invention provides a solution for enabling efficient communication between the units without recurrent transmission of certain data, which then enables a reduction of the message size and a reduction of the amount of utilized communications resources.

Thus, a first communications unit that intends to communicate with a second external communications unit generates a state comprising data or information associated with the first unit. This data of the state are typically used for efficient processing and/or interpretation of data messages but not required for transmission of a data message to an external unit. The communications unit-associated data typically comprises a device-specific data portion including e.g. communications- and session-relevant capabilities and settings of the unit and/or a user-specific portion comprising e.g. Uniform Resource Locator (URL), name, and e-mail address, etc. of the user of the communications unit. This state is then stored in a state memory provided in the unit. Furthermore, a copy of the state is generated and transmitted to the second communications unit, where the state copy is stored in a corresponding state memory.

Since both communications units now have access to the data in the state and state copy they can use it for processing messages that are to be communicated therebetween for the purpose of reducing the message sizes and, thus, save communications resources.

For example, an application message generated in the first communications unit and intended to an application in the second unit is processed using the state stored in the first unit. During this message processing, data contained in the state and found in the message, typically in the header portion of the message, is removed from the message prior transmission thereof. The resulting reduced-size message is then transmitted to the external second communications unit. There the message is anew processed by re-entering the data removed by the first unit into (the header of) the message using the data in the state copy. The original message is then recreated and can be passed up to the application layer for further processing. A similar procedure is performed when transmitting a message in the other direction, i.e. a message is generated in the second unit, processes by removing data therefrom using the state copy, transmitted to the first unit where it is anew processed by adding the removed data using the state.

In addition to transmitting the state copy to the second communications unit, the first unit preferably generates a state copy identifier, e.g. as a hash function value of, at least a portion of, the data in the state/state copy. This identifier is then transmitted to the second unit, preferably in a list containing information of states available at the first unit. Alternatively, the first communications unit transmits some data that allows calculation of the identifier in the second unit. Once the second unit receives the identifier, or data enabling identifier-calculation, and the state copy, it calculates a second state copy identifier. This calculated identifier is subsequently compared with the identifier received from the first unit. If they match the state copy is considered successfully provided and can be stored in the second unit. When the second has determined that the two identifiers match, it can conclude that the state is present in the first communications unit and that it can use the stored state copy for processing messages to be transmitted to the first unit.

The second communications unit can also acknowledge successful reception of the state copy for the first unit. In such a case, acknowledge information, e.g. a dedicated acknowledge identifier received from the first unit or the state copy identifier, is returned or transmitted to the first communications unit. Alternatively, the second communications unit processes a message that will be transmitted to the first unit using the state copy. The first communications unit can then deduce that the second unit has received the state copy since this copy has been used in the processing of the now received message.

The teaching of the present invention can advantageously be applied to message compression. In such a case, the state or state copy is used during compression in order to reduce the size of the resulting compressed message by removing communications unit-associated data therefrom. Correspondingly, during decompression, the state or state copy is used to re-enter the omitted data and recreate the original uncompressed data message. The SigComp protocol is a typical example of a protocol that can be used in such a message compression scheme.

The invention is advantageously applied to communications systems with limited amount of communications resources and bandwidth poor links, where the general need of reducing the sizes of the communicated messages is particularly evident. Typical examples are radio communications systems such as Global System for Mobile communications (GSM), General Packet Radio Service (GPRS), Enhanced GPRS (EGPRS), Enhanced Data rates for GSM Evolution (EDGE), Universal Mobile Telecommunications System (UMTS) and different Code Division Multiple Access (CDMA) communications systems, but also other communications systems such as local area networks could benefit from the invention.

The invention offers the following advantages:
Enables reduction of the sizes of data and application messages transmitted between communications unit in a communications system;
Saves communications resources by reducing the amount of resources utilized for inter-unit communication;
Can be applied to different compression techniques in order to enhance message compression and decompression; and
Can be applied to different types of data and application messages.

Other advantages offered by the present invention will be appreciated upon reading of the below description of the embodiments of the invention.

SHORT DESCRIPTION OF THE DRAWINGS

The invention together with further objects and advantages thereof, may best be understood by making reference to the following description taken together with the accompanying drawings, in which:

FIG. 1 is a schematic overview of a communications system according to the present invention exemplified as a radio communications system offering Push to Talk (PTT) services to connected user communications units;

FIG. 2 schematically illustrates typical data contained in a state according to the present invention;

FIG. 10 is a flow diagram illustrating additional steps of the data signaling method of FIG. 9;

FIG. 11 is a flow diagram illustrating additional steps of the data signaling method of FIG. 9;

FIG. 12 is a flow diagram illustrating additional steps of the data signaling method of FIG. 9.

DETAILED DESCRIPTION

Figure 1:
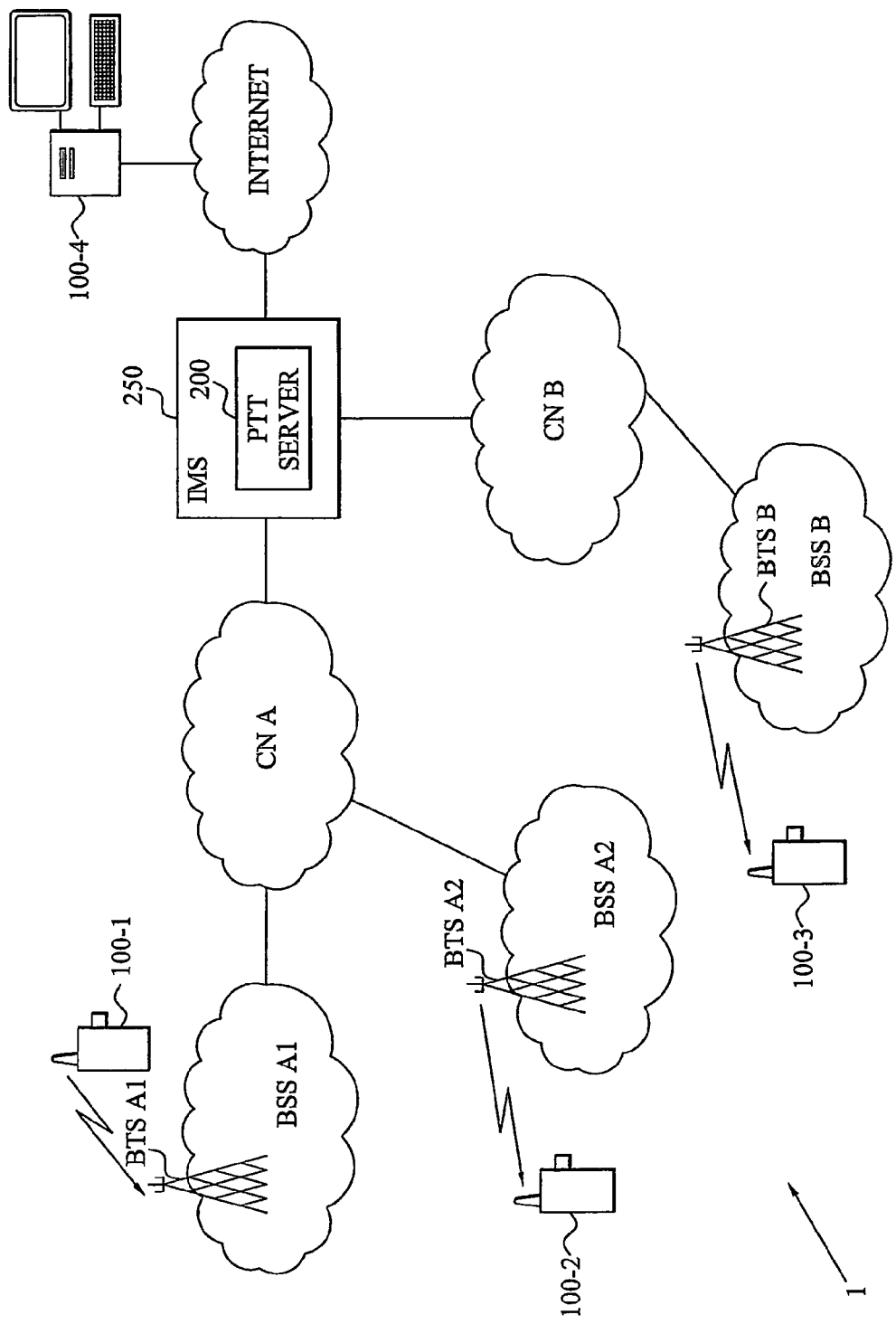

Throughout the drawings, the same reference characters will be used for corresponding or similar elements.

The present invention generally relates to message-based data signaling between communications units in a communications system. The invention is directed to reducing the sizes of communicated data messages and, thus, reducing communications resource utilization in the system by introducing a state-mediated data signaling.

The present invention is based on the observation that certain fields in communicated messages typically more or less often comprise the same information and data for a specific pair or combination of communications units. Thus, this same data is transmitted over and over again for the messages between the communications units. The invention provides a solution for enabling efficient communication between the units without recurrent transmission of certain data, which then enables a reduction of the message size and a reduction of the amount of utilized communications resources.

According to the invention a state that comprises this data or information that is applicable to, i.e. common for, multiple data messages is generated in one of the communications units. A solution for providing a copy of this state to external communications units, to which data messages are to be transmitted and/or from which data messages are to be received, is then presented. Since the communications units then will have access to the state or a copy thereof, the corresponding data in the state can be omitted from the communicated messages, resulting in a reduction of the overall size of the messages transmitted between the units, i.e. in both directions.

In the following the present invention will be described and disclosed with reference to a radio communications system providing communications services to connected mobile units. However, the present invention is not limited thereto but can be applied to other communications system, in which units conduct message-based data communication. A typical example could be a computer communicating with another computer or server in a local area network or over Internet. The invention is, however, advantageously applied to communications systems with limited amount of communications resources and bandwidth poor links, where the general need of reducing the sizes of the communicated messages is particularly evident. Typical examples are radio communications systems such as Global System for Mobile communications (GSM), General Packet Radio Service (GPRS), Enhanced GPRS (EGPRS), Enhanced Data rates for GSM Evolution (EDGE), Universal Mobile Telecommunications System (UMTS) and different Code Division Multiple Access (CDMA) communications systems.

FIG. 1 illustrates an example of a radio communications system exemplified as a cellular communications system 1 providing push-to-talk (PTT) services to connected communications units 100-1 to 100-4.

In addition to the typical network architecture with a radio access network comprising a number of base station systems BSS A1, BSS A2; BSS B with base transceiver stations or node B BTS A1, BTS A2; BTS B and core network CN A; CN B, the radio communications system 1 comprises an IP-multimedia sub-system (IMS) 250 with a PTT server 200. This PTT server 200 typically handles call set-up signaling for PTT calls and the flow control of PIT traffic. Furthermore, real-time routing of IP packets carrying the speech data to the correct receiving user equipment 100-2; 100-3; 100-4 is managed by the PTT server 200.

In the figure, four PTT supporting user handsets or equipment 100-1 to 100-4 are illustrated. The user equipment 100-1 to 100-4 comprises a PTT client implemented therein and is equipped with a PTT hardware or software button used for performing push to talk conversation. The users (owners) of the equipment 100-1 to 100-4 typically have a service agreement, e.g. subscription, with the PTT service provider (often the network operator). The user equipment 100-1 to 100-3 can be a (conventional) mobile unit or telephone configured with a PTT client. Also a computer or laptop 100-4 connected to the PTT server 200 over e.g. Internet is possible.

In a PTT session, a first user wants to communicate with one (one-to-one communication) or several (one-to-many) other users through PTT communication. The user typically selects the friend(s) to communicate with from an address book or PTT book in his communications unit 100-1. This address book preferably also informs, i.e. provides presence information, the user, which of his friends that presently are connected to the communications system 1 and therefore are able to participate in a PTT session. The user then presses a PTT button on his unit 100-1. This PTT button could be a hardware button or implemented in software in the unit 100-1. When the button is pressed a session setup signaling is started. When this initial setup is finished the user can start to talk with his friend, i.e. a talk burst starts. When the user releases the button, or presses a PTT stop button, the talk burst ends. During the talk burst, i.e. during the speech, the talk (speech) is sampled, speech coded and packed into a number or data packets, typically Adaptive Multi Rate (AMR) packets or frames, as is known in the art. Before transmission to the friends' communications unit 100-2 to 100-4 over the radio communications system 1, the AMR packets or frames are packed into IP packets. The actual number of AMR packets per IP packet typically depends on the acceptable level of overhead, the used IP version and/or on header compression. Furthermore, Real-time Transport Protocol (RTP) is preferably used in the GPRS access and core network. The transmitted IP packets are then transmitted from the user equipment 100-1 through base station BS A1, base station system BSS A1 and core network CN A to the PTT server 200. The server then routs the packets to the intended communications units 100-2 to 100-4.

Although the PTT server 200 has been illustrated as one communications endpoint in the figure with a user equipment 100-1 as the other endpoint, a dedicated communications functionality, a Proxy-Call Session Control Function (P-CSCF), is typically arranged in the IMS server 250 for receiving and transmitting messages on behalf of the PTT server 200 and other IMS service nodes. The two communicating endpoints could then be regarded as this P-CSCF and the user equipment.

In PTT services and other IMS services the communications units communicate using Session Initiated Protocol (SIP), Session Description Protocol (SDP), Real Time Streaming Protocol (RTSP) and other application protocol messages. Such messages typically comprise data fields that are (always) populated with the same data. This means that multiple messages transmitted from a first communications unit and intended communications unit comprise a first portion of data, typically provided in the message header, that is common for the messages and a second data portion, typically payload portion and some of the data in the header, that differs between the messages. This common so called communications unit- or user-associated data is typically used in the communications unit for efficient processing and/or interpretation of the data messages. Take SIP as an example. Capabilities and settings of the SIP-enabled communications unit are communicated during session initiation, and tend not to change unless the capabilities of the device change. Similarly, user-specific information such as the user's Uniform Resource Locator (URL), name, and e-mail address, etc. will likely not change on a frequent basis and will appear regularly in SIP signaling involving a specific user.

Figure 2:
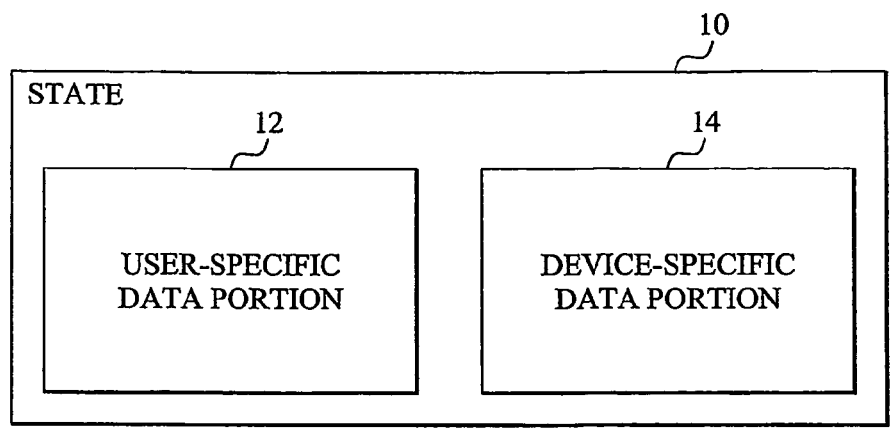

According to the invention, a state comprising this communications unit-associated data, or at least a portion thereof, common for multiple data messages to be communicated is generated. FIG. 2 schematically illustrates this state 10. As was briefly discussed above, the communications unit-associated data and, thus, the state preferably comprise a user-specific data portion 12 (URL, e-mail address, name, etc.) and/or a device-specific data portion 14 (device capabilities, settings, SDP settings, SIP settings, RTSP settings, etc.). By allowing two communicating units to both have access to the data in the state 10, this data could be omitted from the inter-unit-communicated messages in order to reduce the size of the messages and increases the efficiency of the message flows. Since the state 10 is accessible by the communications-participating units, they can successfully process and interpret any received messages.

Figure 3:
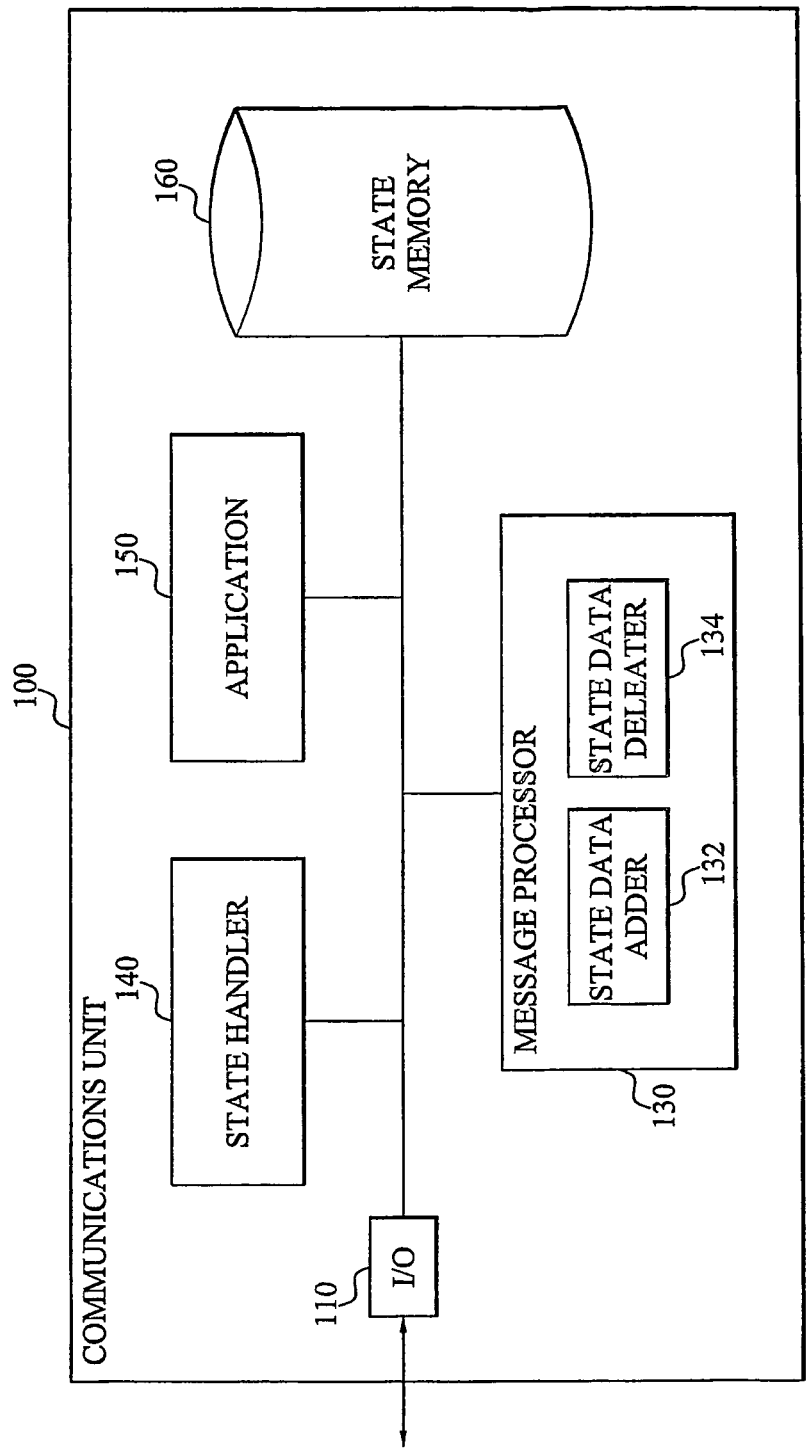
FIG. 3 is a block diagram of an embodiment of a communications unit according to the present invention.

FIG. 3 illustrates a block diagram of a communications unit 100 according to the present invention. This unit 100 could be a user equipment, such as a mobile unit, mobile telephone, Personal Digital Assistant (PDA) or a computer. Furthermore, a SIP, SDP, RTSP or another application protocol server could be a communications unit 100 according to the invention. Further non-limiting examples of communications units 100 are a PTT servers and other IMS servers, the P-CSCF, for example provided in a server or in a network node in a communications system.

The communications unit 100 generally comprises an input and output (I/O) unit 110 for conducting communications with external units in a communications system. This I/O unit 110 is in particular adapted for transmitting and receiving data messages to and from, respectively, an external unit. Furthermore, transmission of states and reception of state copies for the purpose of increasing the efficiency of the data communication are managed by the I/O unit 110.

The communications unit 100 also comprises an application 150 that schematically represents a functionality in the unit 100 that generates messages to be communicated to external units and processes messages received from such external units. For the example with a PTT-enabled communications unit 100, the application could manages speech sampling, speech coding and packing into a number of data packets, which are, in turn, grouped into data messages. Correspondingly, when the communications unit 100 receives a message comprising PTT data, the application 150 could be adapted for unpacking the data therein and re-create the speech that is replayed for the user of the unit 100.

A state handler 140 is provided in the communications unit 100 for managing states comprising communications unit-associated data according to the present invention. The state handler 140 is preferably configured for generating states to be used in the message-based communication with external units. Alternatively, the states could be generated elsewhere in the unit 100, e.g. in the application 150. The state handler 140 can be adapted for generating one state that is associated with the communication unit 100 and applicable for multiple messages from the application 150. This one state is then provided to one or multiple external units, with which the unit 100 wants to communicate. Alternatively, a dedicated state is generated and provided to each external communicating unit. In such a case, the communications unit 100 will have access to several states where a given state is used in the communication with a specific external unit or a specific group of external units. Once the state handler 140, or some other means in the unit 100, has generated the state, the state handler 140 stores it in an associated state memory 160 provided in the unit 100. Alternatively, the state memory 160 could be provided elsewhere as long as the communications unit 100 has access to the data therein.

The state handler 140 is also configured for creating a copy of the generated and stored state. This state copy is then transmitted by means of the I/O unit 110 to the external unit(s), with which the communication unit 100 is to conduct message-based communication. Correspondingly, if the communications unit 100 receives a state copy generated by an external unit, the I/O unit 110 forwards the received state copy to the state handler 140 that stores the state copy in the memory 160.

The state could be generated per session basis for a given pair or combination of communications units. Thus, the state is only used for processing communicated messages during a given session. When the session is ended, the state and state copy could be deleted from the state memory 160. Alternatively, it could be possible that the data in the state and state copy is applicable for messages in several different communications session with an external unit. The state/copy is then kept stored in the state memory 160 also when a session is ended. However, once the data contained in the state is changed, e.g. due to a change in the settings or capabilities of the communications unit 100, a new copy of the state is preferably generated and transmitted to the external unit(s), which then update(s) the associated state memory 160.

For example, if the communications unit 100 is a mobile unit that performs PTT communication with other units by means of a PTT server, the state memory 160 preferably comprises a state comprising data associated with the mobile unit. A copy of this state has preferably been provided to the IMS server, typically to a P-CSCF functionality in the server. This P-CSCF functionality typically operates as the communication interface of the IMS server and its including nodes, e.g. PTT server, towards mobile unit. Then the mobile unit 100 and the server can efficiently and in a resource-saving manner transmit messages between each other using the state and state copy. The mobile unit 100 could also comprise a state copy in the memory 160, where this state copy has been generated by the P-CSCF functionality and comprises data associated therewith. Then both the mobile unit-associated state and state copy and the IMS-associated state and state copy can be used for the message-based communication.

Correspondingly, the IMS server (P-CSCF functionality) preferably comprises a state copy for some or all mobile units it communicates with. The server then uses a first state copy for the generation of messages intended to a first mobile unit and/or for processing messages received from this first unit. A second state copy is used for messages associated with a second mobile unit and so on.

As was discussed above, if the communications unit 100 has transmitted a state copy to an external communications unit, it can omit the data contained in the state or at least a portion thereof from the messages generated by the application 150 and intended to be transmitted to the external unit. In such a case, the application 150 could be configured for omitting the data in the state during generation of messages. Alternatively, a message processor 130 receives the original message from the application 150 and includes functionality 134 for removing the data that is found in the state from the message, typically from the header portion of the message. The size of this processed message is then smaller than the corresponding size of the original message. The reduced-size message is then forwarded to the I/O unit 110 and transmitted to the external unit.

When the I/O unit 110 receives a reduced-size message from an external unit, it informs the state handler 140 to provide data from its state or the state copy associated with and previously received from the external unit. The message and the state copy data is provided to the message processor 130 that comprises functionality 132 for entering the data in the state copy or at least a portion thereof in the "missing or empty" data fields of the received message, typically in the header portion thereof. The resulting original-version message is then forwarded to the application 150 that now, when the missing data has been added, can successfully process the message.

Thus, the data in the state and state copy of the invention is applicable to multiple messages to be transmitted to external communications unit, i.e. present in (all of) these messages, and is typically required for message processing or interpretation in an external communication unit, but is typically not required for successful delivery of the messages. This data is then omitted or removed from messages before transmission thereof using the state/state copy. In addition, before processing the messages in the receiving communications unit, the omitted or removed data is entered in the messages using the state copy/state, which results in a successfully prosecutable message in the application.

The communications unit 100 could be provided with a state handler 140 that is configured for generating states and using them in the message processing. In an alternative embodiment, the state handler 140 does not itself generate states but is instead configured for using state copies received from external units. In yet another embodiment, the state handler 140 can perform both these functionalites, i.e. use both own-generated states and received state copies for message processing.

Furthermore, if the communications unit 100 is implemented for basically only transmitting messages to the external unit and not receiving any therefrom, the message processor 130 could be implemented to only include the state data deleting or removing functionality 134. Correspondingly, if the communications unit 100 is expected to mostly only receive messages from the external unit without transmission of any thereto, the message processor 130 could comprise the state data adding functionality 132 but then lacks the state data deleater 134. However, in a preferred implementation the message processor 130 comprises both these message size modulating means 132, 134.

The units 110, 130, 132, 134, 140 and 150 of the communications unit 100 may be provided as software, hardware or a combination thereof. The units 110, 130, 132, 134, 140, 150 and 160 may be implemented together in the communications unit 100. Alternatively, in particular for a server-implemented embodiment of a communications unit in a communications system, a distributed implementation is also possible with some of the units provided in different network nodes.

The teachings of the present invention could also be applied to compressed message-based communication between communications unit. The data in the generated state and state copy could then also, or alternatively, be used during compression and/or decompression of data messages. In such a case, the state and state copy preferably enhances the message compression by enabling a reduction of the message size after compression compared to messages compressed without usage of the state of the invention.

Figure 4:
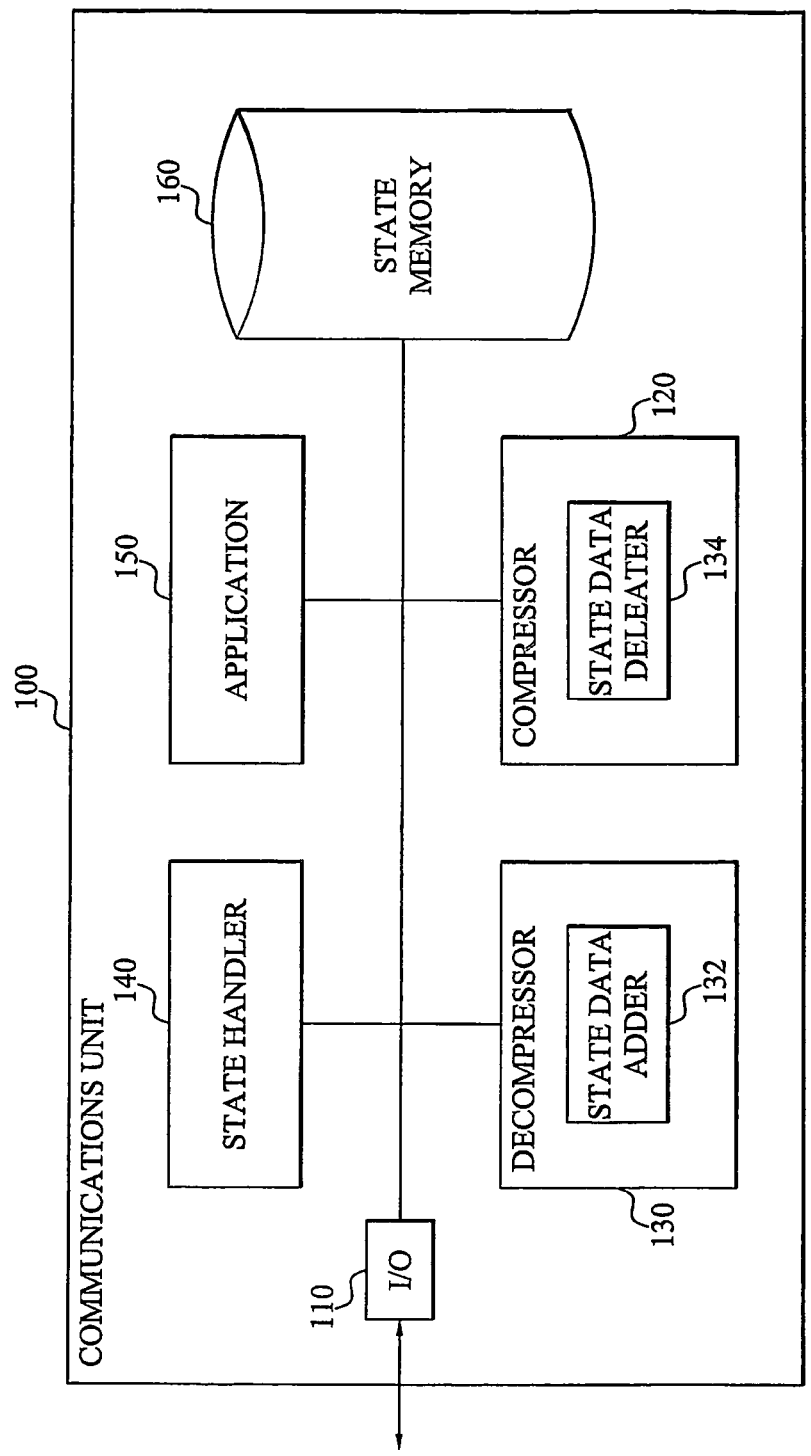
FIG. 4 is a block diagram of another embodiment of a communications unit according to the present invention.

FIG. 4 is an illustration of a schematic block diagram of a communications unit 100 adapted for compressed message-based communication according to the invention.

The communications unit 100 comprises a compressor 120 adapted for compressing messages from an application 150 using a state provided in a state memory 160. Data in the state or state copy also present in the message is then typically removed from the message during compression using the state data deleting means 134. As a result the total size of the compressed message is reduced.

A decompressor 130 is provided in the unit 100 for decompressing a received compressed message from an external communications unit. The decompressor 130 is preferably configured for decompressing the message based on a state or state copy received from and associated with the external unit that transmitted the compressed message. Data stored in the state/state copy, or at least a portion of this data, is typically entered or added to the message during compression by means of a state data adder 132.

A state copy generated by the state handler 140 can be transmitted to an external unit in a (uncompressed) message, as was discussed above in connection with FIG. 3. Alternatively, the state copy is transmitted in a compressed message. Furthermore, this compressed message could also comprise additional data besides the state. This additional data could be application data or message from the application 150, instructions or bytecode to inform the external unit how to process the data in the compressed message, etc.

For compression and decompression purposes the state-comprising communications unit-associated data applicable to multiple messages according to the present invention could be a User-Specific Dictionary (USD). A copy of the USD can then in a communications session be included as part of an initial message to an external communicating unit, even before the subsequent more time critical signaling messages are generated from the application. This then enables an increase in compression efficiency and reduction in utilized communications resources once the messages start to flow between the units.

The remaining units and means in the communications unit 100 has similar function as the corresponding units and means disclosed in the embodiment of FIG. 3 and are not further discussed.

Figure 5:
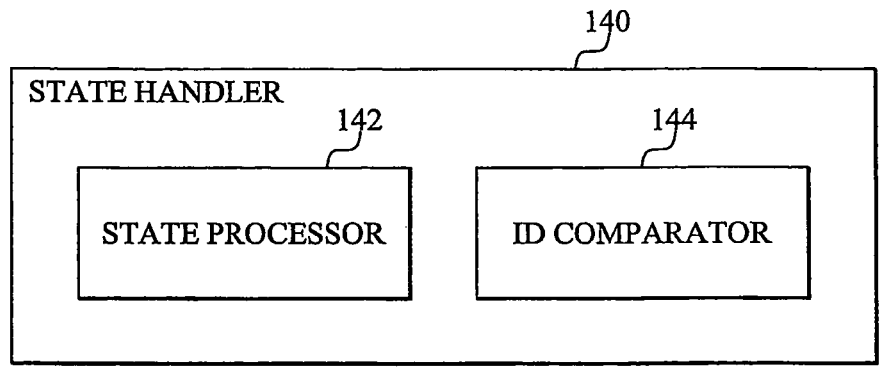
FIG. 5 is a block diagram illustrating the state handler of FIGS. 3 and 4 in more detail.

FIG. 5 is a schematic block diagram of the state handler 140 of FIGS. 3 and 4. The state handler 140 preferably comprises a state processor 142 that is adapted for generating a state and a state copy comprising data associated with the communications unit, in which the processor 142 is implemented. The processor 142 preferably also provides a list of available states in the communications unit. This list could then comprise information of the different states that are stored in the state memory and accessible by the state handler 140. The list typically comprises an identifier of the respective available states. This identifier could be a hash function value of the data in the state, e.g. an identifier calculated using the Secure Hash Algorithm 1 (SHA-1). By transmitting the list containing identifiers of states to an external unit, the communications unit announces its available state that it can use for message processing and compression. Alternatively, instead of transmitting the state copy identifier, data that enables calculation of the identifier could be transmitted, whereby the identifier is subsequently calculated in the receiving unit based on received data.

Correspondingly, the communications unit may receive a state copy from an external unit together with a list of identifiers of available states in the external unit. Alternatively, the list is provided separately from the state copy. The state processor 142 then calculates a second state identifier based on the received state copy, e.g. as a hash functional value of the data therein. This second identifier is brought together with the received identifier list to an identifier comparator 144 provided in the state handler 140. This comparator 144 compares the calculated second state identifier with identifiers in the list. If a match is found, the state copy has been successfully received and can now be used for e.g. message compression and decompression purposes with the external communications unit. Furthermore, the comparator 144 preferable generates a save OK command to the state processor 142 that instructs the processor 142 than it now can save the received state copy in the state memory, unless this has not yet been performed.

The units 142 and 144 the state handler 140 may be provided as software, hardware or a combination thereof. The units 142 and 144 may be implemented together in the handler. Alternatively, a distributed implementation is also possible with some of the units provided elsewhere in the communications unit.

Figure 6:
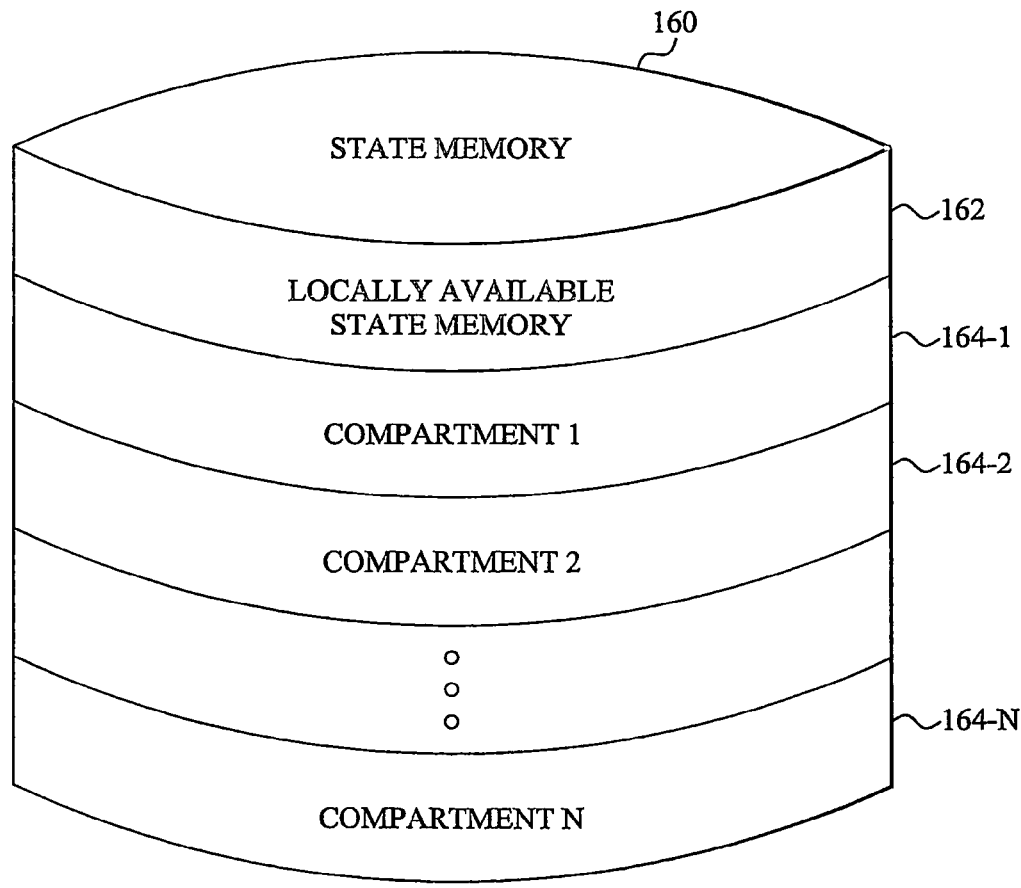
FIG. 6 is an illustration of the state memory of FIGS. 3 and 4.

FIG. 6 is an illustration of an embodiment of a state memory 160 according to the present invention and applicable to the communications units of FIGS. 3 and 4. The memory 160 is preferably divided (logically or virtually) into multiple memory sections 162; 164-1 to 164-N. Firstly, the memory 160 preferably comprises a locally available state memory section 162 that mainly comprises states generated by the communications unit itself. In addition, a number of compartments 164-1 to 164-N dedicated to different external communications unit may be found in the state memory 160. The compartments 164-1 to 164-N could be viewed as an application-specific grouping of state copies that relate to a peer external unit. Depending on the signal protocol employed for the (possibly compressed) message communication, this grouping may relate to application concepts such as: session, dialog, connection or association.

A state copy received from an external communications unit is then preferably stored in a compartment 164-1 to 164-N dedicated to this external unit in the state memory 160. For example, compartment 1 164-1 could comprise one or several state copies from a first external unit, compartment 2 164-2 could comprise one or several state copies from a second external unit and so on. Each such external unit then has access to the limited amount of storage space provided by its compartment 164-1 to 164-N in the memory 160 of the other unit. This means that if the communications unit has received several state copies from a given external unit, the compartment 164-1 dedicated to this external unit in the state memory 160 could be full. If yet another state copy is received from this external unit, state copies already stored in the dedicated compartment 164-1 may have to be removed therefrom in order to release storage space. In order to increase the available storage space for an external unit, a state copy can be copied or moved from a dedicated compartment 164-1 to the locally available memory section 162.

The idea with different dedicated compartments 164-1 to 164-N or sections with received state copies, is to simplify identification of a correct state copy to use once a message is received from a given external unit or is to be transmitted to the external unit. Other solutions that provide a connection between the state copies and the unit they come from could alternatively be employed. For example, each state copy could be stored together with an identifier of the external unit from which it originates.

Returning to FIG. 4, the communications unit 100 can be adapted for acknowledge successful reception of a state copy, e.g. as determined by a comparison of state identifiers. In a first embodiment of the invention, the communications unit 100 receives an acknowledge identifier from the external unit that has transmitted the state copy. When the state copy has been saved e.g. in the compartment dedicated to the external unit in the state memory 160, the communications unit 100 returns the acknowledge identifier to the external unit and consequently announces successful reception of the state copy. The acknowledge identifier could have been provided together with the state copy or in another data message. In another embodiment, the communications unit 100 transmits the identifier of the state copy, either the identifier calculated by the state handler 140 or the identifier received from the external unit in the state list, to the external unit, which then knows that the state copy has been correctly provided. A further possible acknowledge solution could be that the communications unit 100 processes, e.g. compresses, a message from the application 150 and intended to the external unit using the received state copy. Once the external unit receives this message it can deduce that the state copy has been successfully received since the message have been compressed or otherwise processed using the data in the state copy.

The state handler 140 could include a timer or counter that is started once a state copy is transmitted to an external unit. If an acknowledgement of reception (acknowledge identifier, state copy identifier or processed message) has not been received when the timer or counter reaches a predetermined threshold value, the state copy could be retransmitted to the external unit.

The units 110, 120, 130, 132, 140 and 150 of the communications unit 100 may be provided as software, hardware or a combination thereof. The units 110, 120, 130, 132, 140, 150 and 160 may be implemented together in the communications unit 100. Alternatively, in particular for a server-implemented embodiment of a communications unit in a communications system, a distributed implementation is also possible with some of the units provided in different network nodes.

Figure 7:
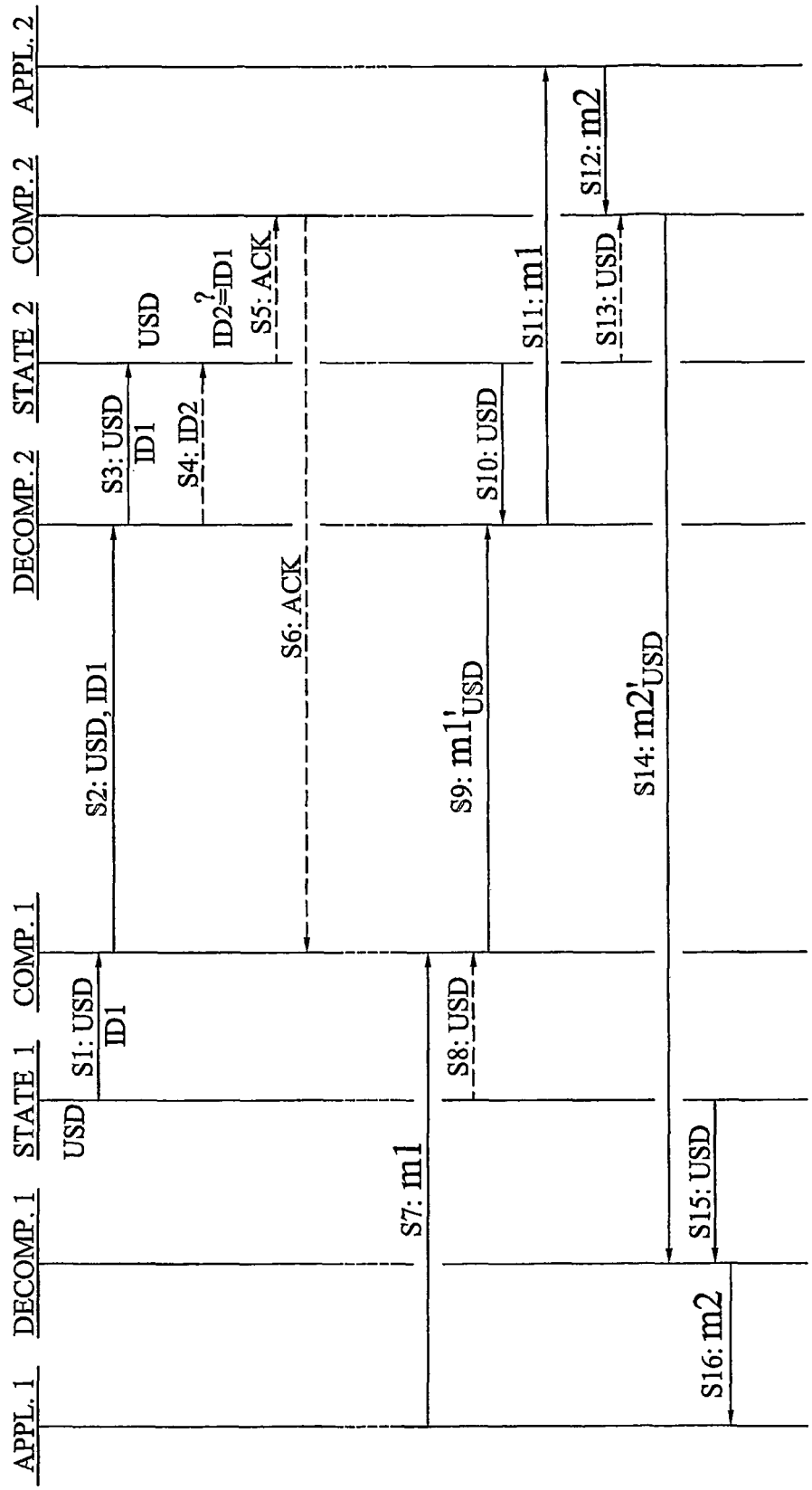
FIG. 7 is a signal diagram illustrating the data signaling method according to the present invention.

FIG. 7 is a signal diagram illustrating the exchange of a state, exemplified as a USD, between two communications units, each comprising an application, decompressor, state handler and compressor, e.g. as illustrated in FIG. 4.

The first communications unit wants to communicate using state-mediated message-based communication with the second unit. In order to reduce the size of the messages and thus save communications resources and speed-up compression and decompression, a USD comprising data (user-specific and/or device specific data) associated with the first communications unit and applicable (common for) multiple messages is generated and stored in a state memory in the first unit. A copy of this USD is then generated and provided together with a USD identifier (ID1) to the compressor of the first unit (S1). There the USD and ID1 are included in a message compressed and transmitted to the second communications unit (S2). Alternatively, the USD and ID1 are transmitted in one uncompressed message, in two different compressed or uncompressed messages. The ID1 is preferably included in a list of available states in the first communications unit.

If the message, possibly messages, comprising the USD copy and ID1 was compressed the decompressor of the second unit decompresses the message and provides the USD and ID1 to the state handler (S3). A second identifier (ID2) is preferably calculated based on the received USD by the decompressor and forwarded to the state handler (S4). Alternatively, the state handler performs this identifier calculation. The state handler could then compare the received ID1 with the calculated ID2. If they match, a correct USD has been received and can be stored in the state memory of the second unit, preferably in a compartment dedicated for the USD and other state copies from the first unit.

The second communications unit could then acknowledge reception of a correct USD copy. The state handler then preferably provides an acknowledge identifier (dedicated acknowledge identifier or USD copy identifier) to the compressor (S5) which then transmits it, possible in or as a compressed message to the first communications unit (S6).

The USD in the first communications unit and the USD copy in the second communications unit can now be used for the continuing data message signaling in order reduce the message sizes, save communications resources and enhance message compression for messages sent in both direction, i.e. both from messages transmitted from the first unit to the second unit and messages transmitted in the opposite direction.

For example, the application in the first communication unit provides a message (m1) to be transmitted to the application of the second unit (S7). The compressor then compresses the message using the USD from the state handler (S8), typically by removing data in the message that is present in the USD and not required for successful transmission of the message over the communications system. The so obtained compressed and size-reduced message (m1'USD) is then transmitted to the second communications unit (S9). There the decompressor decompresses the message using the USD copy from the state handler (S10), typically by re-entering the data previously removed during the compression in the first communications unit. The recreated complete message is then forwarded to the application, which now can use it (S11).

The corresponding procedure can be repeated in the opposite direction, i.e. a message (m2) is generated by the application of the second unit and is to be transmitted to the first communications unit. The steps S12-S16 are then performed in a similar manner to the steps S7-S11.

It could also be possible that the second communications unit generates an own USD, to which the first communications unit preferably should have access. Steps S1-S3 and possible also steps S4-S6 are then repeated but in the opposite direction to what is illustrated in the figure. In such a case, application messages generated by the first application and transmitted to the second communications unit can be compressed or processed using the USD copy associated with the second unit and messages generated by the second application and intended to the first unit can correspondingly be compressed or processed using the USD copy of the first communications unit. Alternatively, both USDs/USD copies can be used for compression and decompression purposes.

Figure 8:
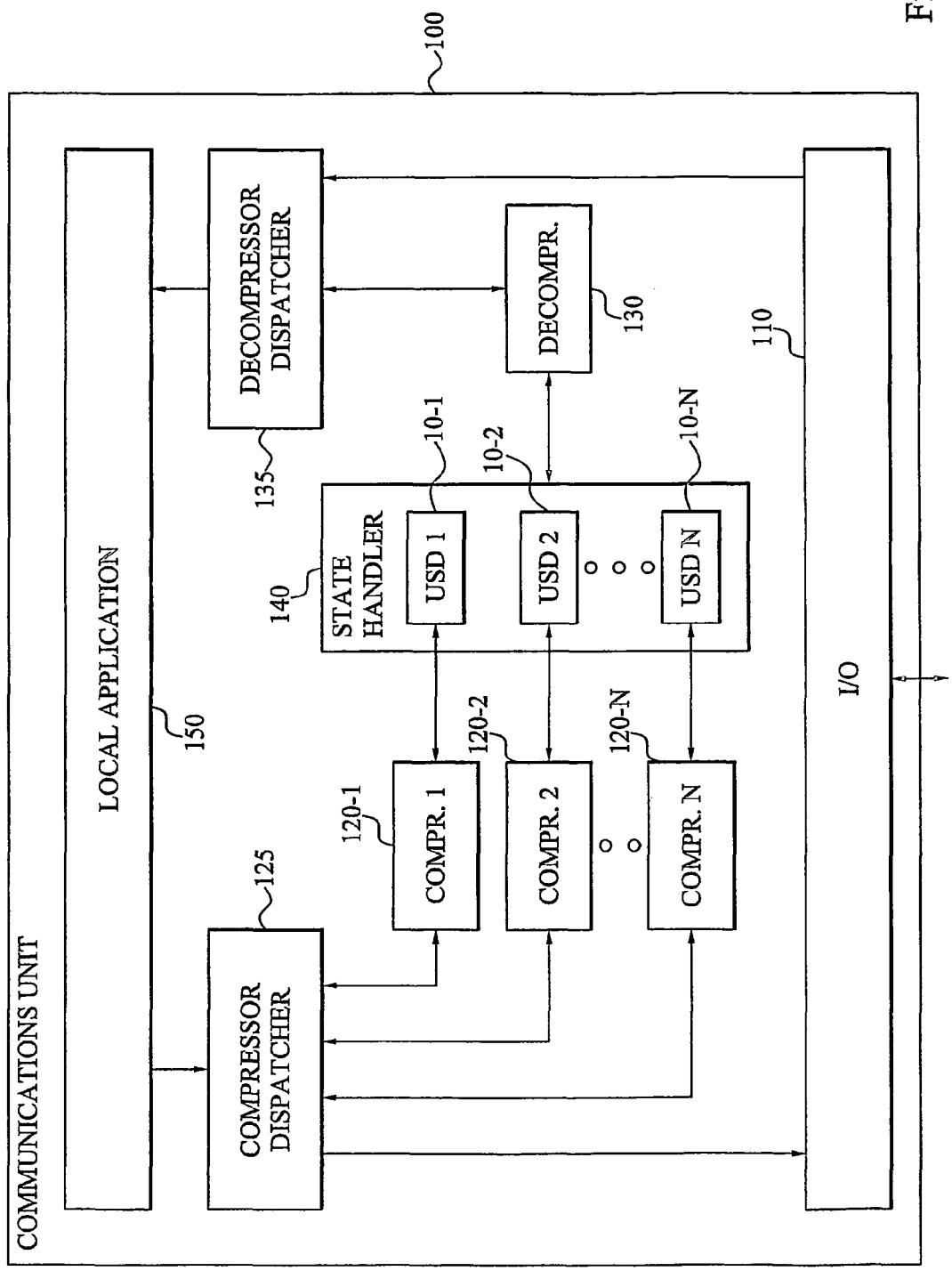
FIG. 8 is a block diagram of yet another embodiment of a communications unit according to the present invention.

FIG. 8 is a more detailed illustration of a communications unit 100 according to the present invention adapted for message compression using the SigComp protocol. This compression protocol is further discussed in the documents [1, 2].

The application 150 is similar to above in FIGS. 3 and 4 and is not further discussed.

A compressor dispatcher 125 is provided in the communications unit 100 as an interface from the application 150. The application 150 supplies the compressor dispatcher with an application message and preferably an identifier of the external unit, to which the message should be transmitted. The compressor dispatcher 125 then invokes a particular compressor 120-1 to 120-N that eventually returns a SigComp message to be forwarded to the remote communications unit. The communications unit 100 also comprises one or several compressors 120-1 to 120-N for converting application messages into compressed SigComp messages. In a first embodiment, a single compressor is used for all message compression. In an alternative and more preferred embodiment multiple compressors 120-1 to 120-N are provided in the unit 100 enabling parallel compression of application messages. In such a case, each state memory compartment and/or external communications unit could have a dedicated compressor 120-1 to 120-N. The (compartment or unit) identifier is then used for delivering the application message to the correct compressor 120-1 to 120-N. Once a compressor 120-1 to 120-N has received an application message from the compressor dispatcher 125, it typically chooses a certain algorithm to encode the data and uses a USD copy 10-1 to 10-N associated with the compartment or remote unit for the compression. These USD copies 10-1 to 10-N are managed by a state handler 140 that is the entity that stores and retrieves USD and other states according to the invention. The state handler 140 preferably has access to one USD 10-1 to 10-N per compressor 120-1 to 120-N. The USDs 10-1 to 10-N are typically arranged in compartments in a state memory or organized in another equivalent manner.

When the compressor 120-1 to 120-N has compressed the application message using a USD copy according to the invention it returns the resulting SigComp message to the compressor dispatcher 125 that forwards it to an I/O unit 110 or transport layer for transmission to the external communications unit.

When the I/O unit 110 receives a SigComp message from an external unit it forwards the message to a decompressor dispatcher 135. This decompressor dispatcher 135 is the interface towards the application 150. The SigComp message is then provided to a decompressor 130, where preferably an instance of the Universal Decompressor Virtual Machine (UDVM) is invoked. The SigComp message will then be decompressed using data in a USD 10-1 to 10-N provided from the state handler 140. A resulting application message (uncompressed SigComp message) is transmitted to the decompressor dispatcher 135 that forwards it to the application 150.

The units 110 to 150 of the communications unit 100 may be provided as software, hardware or a combination thereof. The units 110 to 150 may be implemented together in the communications unit 100. Alternatively, in particular for a server-implemented embodiment of a communications unit in a communications system, a distributed implementation is also possible with some of the units provided in different network nodes.

The embodiment of the present invention applicable for SigComp can surprisingly reuse a modified version of transmission of shared states between two endpoints as discussed in the document [2].

In clear contrast to a state of the present invention that comprises communications unit-associated data applicable (common) to multiple applications messages and used for reducing the size of these messages and, thus, save communications resources, a shared state consists only of an uncompressed message. This shared state is used solely for compression relative messages received by an endpoint prior to a current compressed message. Furthermore, once a shared state is received by an endpoint it is passed up to higher layers, i.e. provided to the application in the endpoint. In addition, the first endpoint generating the shared state stores it in a compartment, in the state memory, dedicated to the external or second endpoint. However, the shared state is not stored in the second endpoint that subsequently receives the shared state.

The purpose of shared states in SigComp is thus to compress subsequent messages based on a previously received message in a one-way communication, whereas the purpose of the present invention is to use states for reducing the amount of data that has to be transmitted in data messages between communications units, i.e. for message transmission in both directions.

Figure 9:
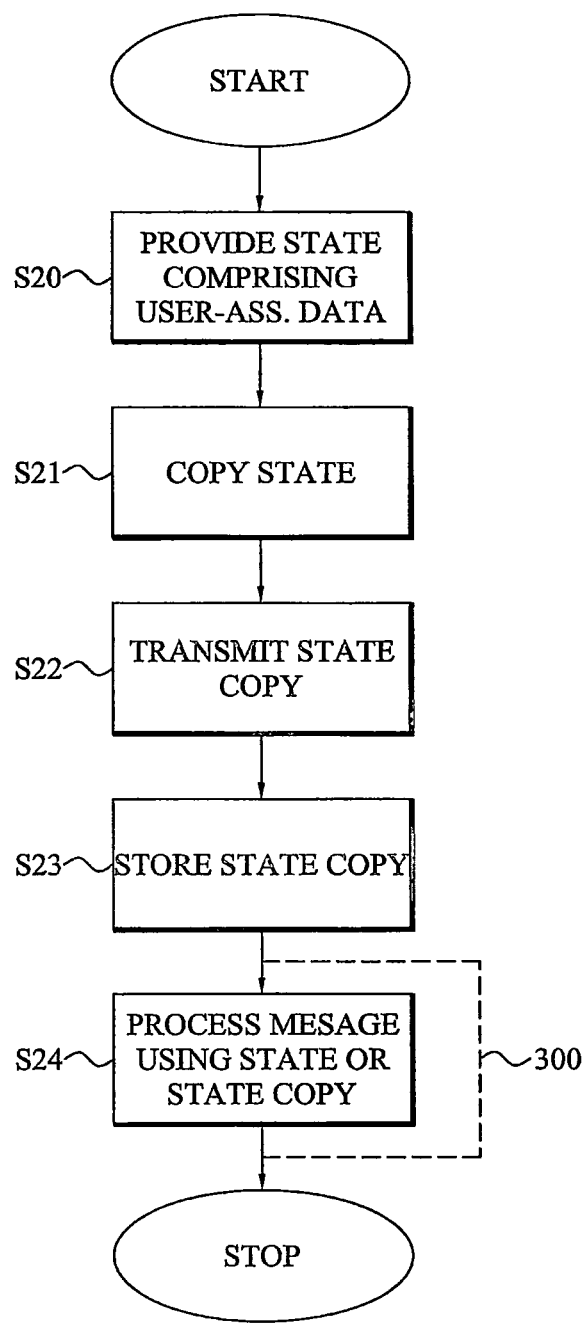
FIG. 9 is a flow diagram illustrating the data signaling method according to the present invention.

FIG. 9 is a flow diagram illustrating the state-mediated data signaling method according to the present invention. The method starts in step S20 where a first communications unit provides a state comprising data associated with the unit and applicable for multiple data messages that are to be transmitted to at least a second external communications unit. In a next step S21, a copy of this state is generated in the first unit. This copy is then transmitted to the second communications unit in step S22, where it is stored in step S23. The first communications unit now has access to the state and the second communications unit has access to a copy or instance of this state.

The state and state copy are then used for processing (application) messages transmitted between the communications units by modulating (decreasing or recreating) the size of the messages in a next step S24. This step can be repeated for multiple messages transmitted from the first unit to the second unit and/or transmitted from the second unit to the first unit, schematically illustrated by the dotted line 300. The method then ends.

FIG. 10 is a flow diagram illustrating additional steps of the method of FIG. 9. The method continues from the step S21 of FIG. 9. In a next step S30, the first communications unit stores the provided state in a locally available section of its associated state memory, unless already stored therein. A first state identifier is then generated and transmitted to the second communications unit in step S31. This identifier could be a hash function value of the data in the state or at least a portion thereof and is preferably transmitted in a list of available states in the first communications unit. The method then continues to the step S22 of FIG. 9.

FIG. 11 is a flow diagram illustrating additional steps of the method of FIG. 9. The method continues from step S22 of FIG. 9. In a next step S40, the second communications unit calculates a second identifier based on the received state copy. This calculated identifier is then compared to the announced state identifier received (in a state list) from the first communications unit in step S41. If they do not match, the state copy is not stored in the second communications unit and the method ends. Optionally, the second communications unit could notify the generator of the state copy, i.e. the first communications unit, that the state copy does not correspond to the received state identifier. However, if the two identifiers match, the method continues to the step S23 of FIG. 9.

FIG. 12 is a flow diagram illustrating additional steps of the method of FIG. 9. The method continues from the step S23 of FIG. 9. In a next step S50, the second communications unit could optionally copy or move the state copy from the compartment dedicated to the first communications unit in the state memory to the locally available memory section. This increases the available storage space for states received from and associated with the first unit. The second unit preferably acknowledges reception of the state copy in step S52, e.g. by returning a dedicated acknowledge identifier or state copy identifier to the first communications unit. Alternatively, or in addition, a message processed in the second unit using the state copy could be transmitted as an acknowledge identifier to the first unit in the step S52.

Figure 13:
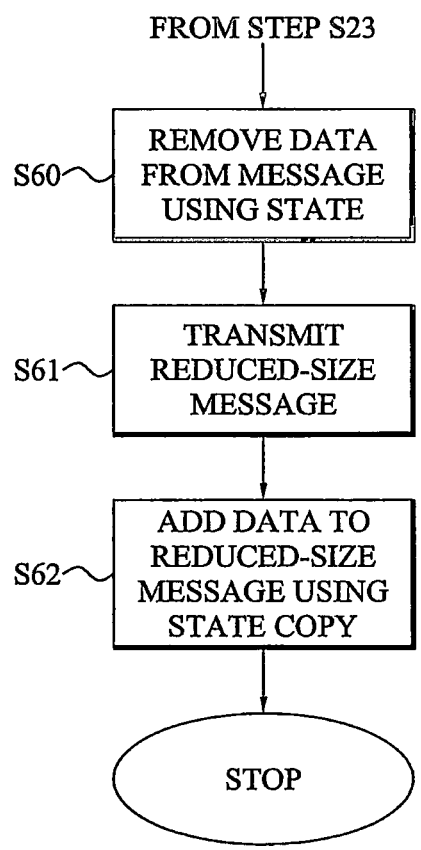
FIG. 13 is a flow diagram illustrating the message-processing step of FIG. 9 in more detail.

FIG. 13 is a flow diagram illustrating the message-processing step of FIG. 9 in more detail. The method continues from the step S23. In a next step S60, data present in the state and not needed for transmission of the message but subsequently used for processing and/or interpreting the message in the remote second unit is removed from (the header of) the message by the first communications unit. The resulting reduced-size message is then transmitted to the second unit in step S61. When the second unit receives this (reduced-size) message, data is then re-entered in (the header of) the message using the state copy in step S62. The method then ends. For implementation of the present invention in communications units employing compressed message communication, the state and state copy are preferably used in the message compression and decompression operations to remove and add data, respectively, in order to reduce the size of any communicated compressed messages transmitted between communicating units.

It will be understood by a person skilled in the art that various modifications and changes may be made to the present invention without departure from the scope thereof, which is defined by the appended claims.

REFERENCES

[1] Price et al, Network Working Group, Request for Comments: 3320, Category: Standards Track, Signal Compression (SigComp), January 2003
[2] Hannu et al., Network Working Group, Request for Comments: 3321, Category: Informational, Signal Compression (SigComp)—Extended Operations, January 2003

The invention claimed is:

1. A data signaling method for message-based communication between a first communications unit and a second communications unit, said method comprising the steps of:
   initiating said message-based inter-unit communication by providing, in said first communications unit, a state comprising communications unit-associated data common to multiple communications messages to be transmitted between said first communications unit and said second communications unit;
   generating a copy of said state;
   transmitting said state copy and a first identifier of said state copy from said first communications unit to said second communications unit;
   generating a second identifier based on said received state copy;
   comparing said received first identifier and said generated second identifier;
   storing said state copy in said second communications unit; and
   processing, if said second identifier corresponds to said first identifier, a communications message of said multiple communications messages using said state or said state copy by modulating a size of said communications message based on at least a portion of said communications unit-associated data.

2. The method according to claim 1, wherein said processing step comprises the steps of:
   said first communications unit removing at least a portion of said communications unit-associated data in said state from said communications message to obtain a reduced-size communications message; and
   said first communications unit transmitting said reduced-size communications message to said second communications unit.

3. The method according to claim 2, further comprising the step of said second communications unit adding at least a portion of said communications unit-associated data in said state copy to said reduced-size communications message to obtain said communications message.

4. The method according to claim 1, wherein said processing step comprises the steps of:
   said second communications unit removing at least a portion of said communications unit-associated data in said state copy from said communications message to obtain a reduced-size communications message; and
   said second communications unit transmitting said reduced-size communications message to said first communications unit.

5. The method according to claim 4, further comprising the step of said first communications unit adding at least a portion of said communications unit-associated data in said state to said reduced-size communications message to obtain said communications message.

6. The method according to claim 1, wherein said storing step comprises the step of storing said state copy in a compartment dedicated to said first communications unit at said second communications unit if said second identifier corresponds to said first identifier.

7. The method according to claim 6, further comprising the step of copying said state copy from said compartment dedicated to said first communications unit at said second communications unit to a locally available state memory at said second communications unit.

8. The method according to claim 1, further comprising the step of storing said state in a locally available state memory at said first communications unit.

9. The method according to claim 1, wherein said inter-unit communication comprises compressed message-based communication between said first and second communications unit, said method comprising the step of said first communications unit compressing said communications message based on said state, and said processing step comprises the step of said second communications unit decompressing said compressed communications message based on said state copy.

10. The method according to claim 1, wherein said inter-unit communication comprises compressed message-based communication between said first and second communications unit, said method comprising the step of said second communications unit compressing said communications message based on said state copy, and said processing step comprises the step of said first communications unit decompressing said compressed communications message based on said state.

11. The method according to claim 9, wherein said multiple communications messages are compressed using a SigComp compression.

12. The method according to claim 1, further comprising the steps of:
said second communications unit receiving an acknowledge identifier from said first communication unit; and
said second communications unit returning said acknowledge identifier to said first communications unit if said second identifier corresponds to said first identifier.

13. A communications unit adapted for message-based communication with an external communication unit, said communications unit comprising:
at least one processor; and,
at least one memory, said at least one memory storing instructions which, when executed by said at least one processor, are operable to perform the functions of:
receiving a copy of a state comprising communications unit-associated data common to multiple communications messages to be transmitted between said communications unit and said external communications unit;
receiving a first identifier of said state copy;
generating a second identifier based on said received state copy;
comparing said received first identifier and said generated second identifier;
storing said state copy; and,
responsive to said comparing, processing a communications message of said multiple communications messages using said stored state copy if said second identifier corresponds to said first identifier, said processing function configured for modulating a size of said communications message based on at least a portion of said communications unit-associated data in said state copy.

14. The communications unit according to claim 13, wherein said communications message is a reduced-size communications message and said processing function comprises adding at least a portion of said communications unit-associated data in said state copy to said reduced-size communications message.

15. The communications unit according to claim 14, further comprising a compressor and decompressor, said adding function being provided in said decompressor for decompressing a received compressed communications message from said external communications unit by adding said at least a portion of said communications unit-associated data in said state copy to said compressed communications message.

16. The communications unit according to claim 13, wherein said processing function comprises removing at least a portion of said communications unit-associated data in said state copy from said communications message.

17. The communications unit according to claim 16, further comprising a compressor and decompressor, said removing function being provided in said compressor for compressing a communications message intended to said external communications unit by removing said at least a portion of said communications unit-associated data in said state copy from said communications message.

18. The communications unit according to claim 15, wherein said compressor and decompressor are configured for signal compression and decompression using a SigComp protocol.

19. The communications unit according to claim 13, wherein said comparing function is configured for generating a storing command if said second identifier corresponds to said first identifier and said storing function is configured for storing said state copy upon reception of said storing command.

20. The communications unit according to claim 13, wherein said storing function is configured for storing said state copy in a compartment dedicated to said external communications unit.

21. The communications unit according to claim 20, further comprising the function of copying said state copy from said compartment dedicated to said external communications unit to a locally available state memory.

22. The communications unit according to claim 13, further comprising, responsive to said comparing function, transmitting an acknowledge identifier to said external communications unit if said second identifier corresponds to said first identifier.

23. A communications unit adapted for message-based communication with an external communication unit, said communications unit comprising:
at least one processor; and,
at least one memory, said at least one memory storing instructions which, when executed by said at least one processor, are operable to perform the functions of:
generating a state comprising communications unit-associated data common to multiple communications messages to be transmitted between said communications unit and said external communications unit;
storing said state;
generating a copy of said state;
providing said state copy for storage in said external communications unit and for providing a first identifier of said state copy to said external communications unit;
receiving an acknowledge identifier from said external communications, said acknowledge identifier being transmitted in response to a correspondence between said first identifier and a second identifier, said second identifier being generated by said external communications unit based on said state copy; and, responsive to said receiving function, processing a communications message of said multiple communications messages using said stored state if said second identifier corresponds to said first identifier as determined by reception of said acknowledge identifier, said processing function being configured for modulating a size of said communications message based on at least a portion of said communications unit-associated data in said state.

24. The communications unit according to claim 23, wherein said processing function comprises removing at least a portion of said communications unit-associated data in said state from said communications message.

25. The communications unit according to claim 24, further comprising a compressor and decompressor, said removing function being provided in said compressor for compressing a communications message intended to said external communications unit by removing said at least a portion of said communications unit-associated data in said state from said communications message.

26. The communications unit according to claim 23, wherein said communications message is a reduced-size communications message and said processing function comprises adding at least a portion of said communications unit-associated data in said state to said reduced-size communications message.

27. The communications unit according to claim 26, further comprising a compressor and decompressor, said adding function being provided in said decompressor for decompressing a received compressed communications message from said external communications unit by adding said at least a portion of said communications unit-associated data in said state to said compressed communications message.

* * * * *

UNITED STATES PATENT AND TRADEMARK OFFICE
CERTIFICATE OF CORRECTION

PATENT NO. : 8,621,107 B2
APPLICATION NO. : 10/551082
DATED : December 31, 2013
INVENTOR(S) : Hannu et al.

It is certified that error appears in the above-identified patent and that said Letters Patent is hereby corrected as shown below:

On the title page, item (75), under "Inventors", in Column 1, Line 1, delete "Lulea (SE);" and insert -- Luleå (SE); --, therefor.

On the title page, item (75), under "Inventors", in Column 1, Line 2, delete "Lulea (SE)" and insert -- Luleå (SE) --, therefor.

On the title page, item (56), under "OTHER PUBLICATIONS", in Column 2, Line 2, delete "3320;." and insert -- 3320; --, therefor.

On the title page, item (56), under "OTHER PUBLICATIONS", in Column 2, Line 5, delete "Christoffersson, J. et al:" and insert -- Christoffersson, J. et al., --, therefor.

On the title page, item (56), under "OTHER PUBLICATIONS", in Column 2, Line 6, delete "3321;." and insert -- 3321; --, therefor.

In the Drawings

In Fig. 3, Sheet 3 of 9, for Tag "134", in Line 2, delete "DELEATER" and insert -- DELETER --, therefor.

In Fig. 4, Sheet 4 of 9, for Tag "134", in Line 2, delete "DELEATER" and insert -- DELETER --, therefor.

In the Specification

In Column 5, Line 46, delete "PIT traffic." and insert -- PTT traffic. --, therefor.

Signed and Sealed this
Twenty-ninth Day of July, 2014

Michelle K. Lee
*Deputy Director of the United States Patent and Trademark Office*

CERTIFICATE OF CORRECTION (continued)
U.S. Pat. No. 8,621,107 B2

In Column 9, Line 27, delete "deleater 134." and insert -- deleter 134. --, therefor.

In Column 16, Line 3, delete "Price et al," and insert -- Price et al., --, therefor.

In Column 16, Line 5, delete "January 2003" and insert -- January 2003. --, therefor.

In Column 16, Line 8, delete "January 2003" and insert -- January 2003. --, therefor.